United States Patent
Foster et al.

(10) Patent No.: US 8,053,265 B2
(45) Date of Patent: Nov. 8, 2011

(54) MITIGATION OF HIGH STRESS AREAS IN VERTICALLY OFFSET STRUCTURES

(75) Inventors: Michael Foster, Issaquah, WA (US); Ijaz H. Jafri, Woodinville, WA (US)

(73) Assignee: Honeywell International Inc., Morristown, NJ (US)

( * ) Notice: Subject to any disclaimer, the term of this patent is extended or adjusted under 35 U.S.C. 154(b) by 161 days.

(21) Appl. No.: 12/366,799

(22) Filed: Feb. 6, 2009

(65) Prior Publication Data

US 2010/0203718 A1  Aug. 12, 2010

(51) Int. Cl.
*H01L 21/00* (2006.01)
(52) U.S. Cl. ............ 438/52; 257/E21.295; 438/50
(58) Field of Classification Search ............... 438/597, 438/689, 50, 52; 257/E21.295, E21.215
See application file for complete search history.

(56) References Cited

U.S. PATENT DOCUMENTS

| | | | |
|---|---|---|---|
| 5,446,616 A * | 8/1995 | Warren | 361/283.2 |
| 6,232,150 B1 | 5/2001 | Lin et al. | |
| 6,369,931 B1 | 4/2002 | Funk et al. | |
| 6,391,742 B2 | 5/2002 | Kawai | |
| 6,756,310 B2 | 6/2004 | Kretschmann et al. | |
| 7,481,113 B2 * | 1/2009 | Seto | 73/514.33 |
| 2003/0179064 A1 * | 9/2003 | Chua et al. | 336/200 |
| 2005/0244099 A1 * | 11/2005 | Pasch et al. | 385/18 |
| 2007/0115082 A1 * | 5/2007 | Schirmer et al. | 335/78 |
| 2008/0074725 A1 * | 3/2008 | Pan | 359/291 |
| 2009/0014296 A1 * | 1/2009 | Weber et al. | 200/181 |

* cited by examiner

*Primary Examiner* — Matthew Smith
*Assistant Examiner* — Christine Enad
(74) *Attorney, Agent, or Firm* — Lowe Graham & Jones PLLC

(57) ABSTRACT

Alternative methods of constructing a vertically offset structure are disclosed. An embodiment includes forming a flexible layer having first and second end portions, an intermediate portion coupling the first and second portions, and upper and lower surfaces. The distance between the upper and lower surfaces at the intermediate portion is less than the distance between the upper and lower surfaces at the first and second end portions. The first end portion is bonded to a base member. The second end portion of the flexible layer is deflected until the second end portion contacts the base member. The second end portion is bonded to the base member.

20 Claims, 4 Drawing Sheets

MITIGATION OF HIGH STRESS AREAS IN VERTICALLY OFFSET STRUCTURES

STATEMENT OF GOVERNMENT INTEREST

This invention was made with Government support under Contract No. W31P4Q-07-D-0025 awarded by the U.S. Army. The Government has certain rights in the invention.

BACKGROUND OF THE INVENTION

Vertically offset silicon structures for use in microelectromechanical systems (MEMS) or microsystem technology (MST) or nanotechnology can be created by, employing a voltage V, anodically bonding a silicon structure 5 to an etched glass wafer 10 (FIG. 1-1), removing the handle material from the silicon, and then pushing parts of the silicon into contact with the glass while performing a second anodic bond using the voltage V (FIG. 1-2). During formation of this second bond, the silicon 5 is pulled down to the glass 10, and high stresses can develop near the anchor of the push-down structure where the first anodic bond took place. These stresses can cause fracture in the silicon push-down structure 5 or otherwise have a negative impact on the performance of the mechanism.

BRIEF DESCRIPTION OF THE DRAWINGS

Preferred and alternative embodiments of the present invention are described in detail below with reference to the following drawings.

FIGS. 2-1 to 4-2 illustrate construction of vertically offset structures according to alternative embodiments of the invention.

DETAILED DESCRIPTION OF THE PREFERRED EMBODIMENT

Figure 1:
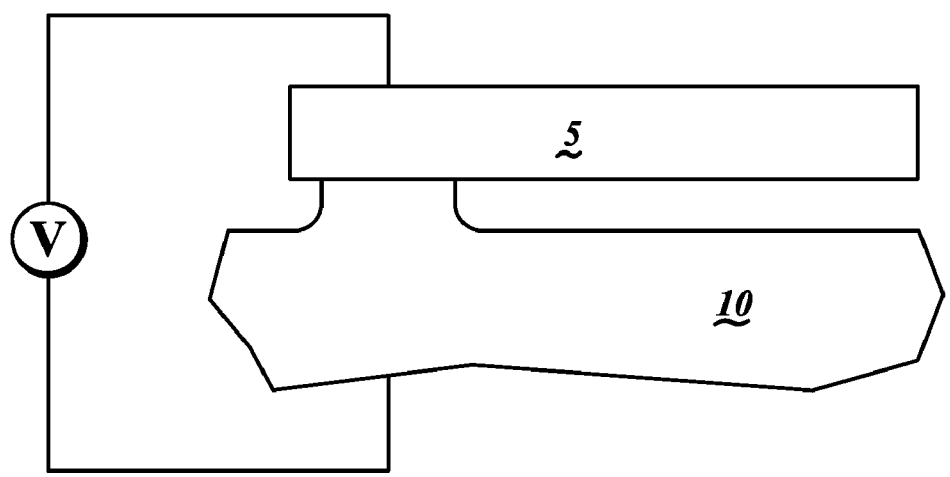
FIGS. 1-1 and 1-2 illustrate construction of a vertically offset silicon structure in accordance with the prior art.
Figures 1, 2:
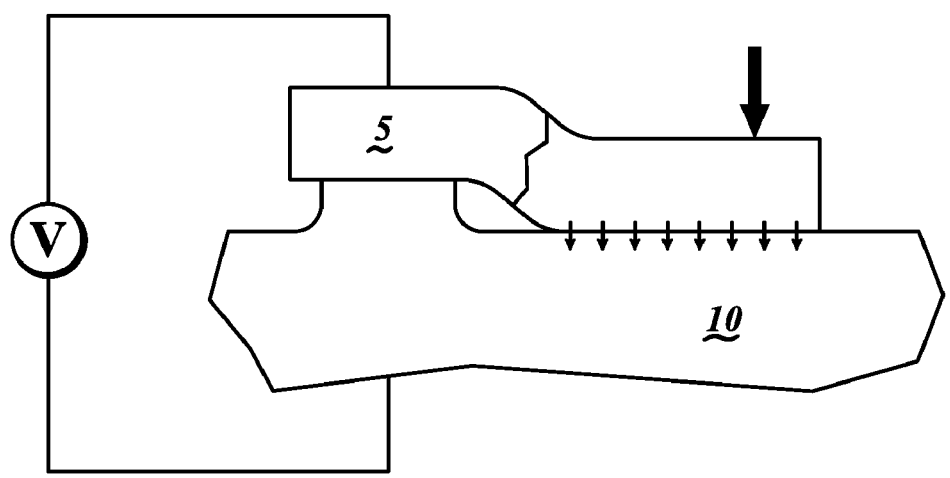
Figures 1, 2:
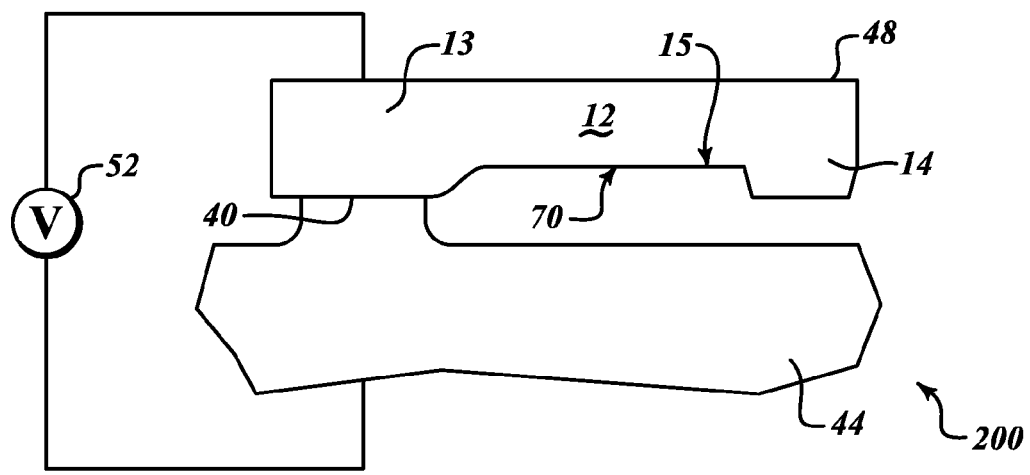
Figure 2:
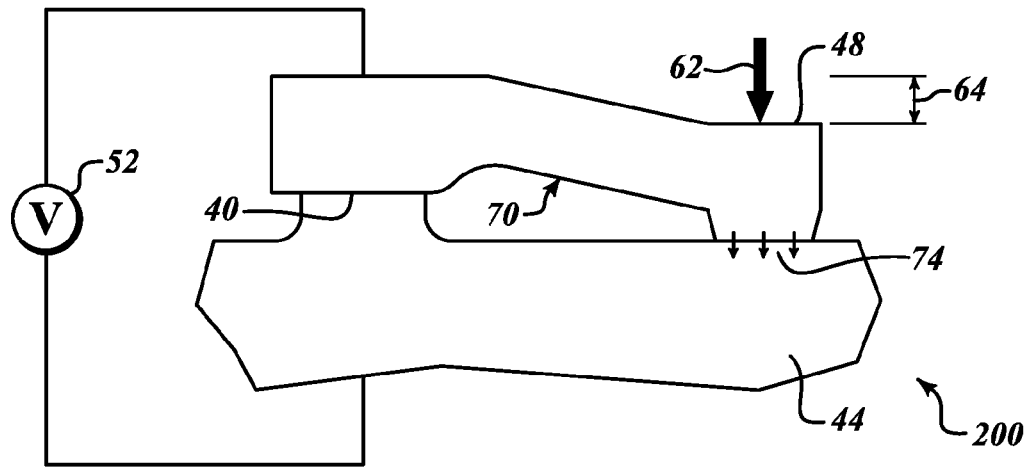

FIGS. 2-1 and 2-2 illustrate side views of the construction of a vertically offset structure 200 of a microelectromechanical system (MEMS) device formed in accordance with one embodiment of the invention. The structure 200 is formed from a silicon layer 12 and a base 44. In an embodiment, the base 44 is made of glass, although the base may alternatively be composed of silicon on oxide (SOI), Silicon-oxide-Silicon-oxide-Silicon (Double SOI), or Silicon on Metal (SOM). Additionally, in alternative embodiments and combinations, the layer 12 (as well as the layer 46 discussed below herein) and base 44 may be composed of conducting materials (e.g., silicon, polysilicon, gold, aluminum or other metal), non-conducting materials (e.g., silicon nitride, silicon oxide, etc.) or semiconducting materials (e.g., Si, InP, GaAs, etc.) The silicon layer 12 includes first and second end portions 13, 14, an intermediate portion 70 coupling the first and second end portions, and upper and lower surfaces 48, 15 extending over the length of the layer 12. The intermediate portion 70 is formed by etching the silicon layer 12, such that the distance between the upper and lower surfaces 48, 15 at the intermediate portion is less than the distance between the upper and lower surfaces at the first and second end portions 13, 14.

After the intermediate portion 70 is formed, the first end portion 13 is bonded to the glass base 44 to form an anchor 40. In the case of a silicon layer 12 and a glass base 44, anodic bonding may be used to bond the layer 12 to the base 44. When the base 44 and silicon layer 12 are made of different materials, appropriate bonding including but not limited to fit, fusion, eutectic, epoxy attachment techniques known to those having ordinary skill in the art may be used.

Subsequently, and as best illustrated in FIG. 2-2, the second end portion 14 of the silicon layer 12 is deflected a vertical distance 64 until the second end portion contacts the base 44 as indicated by reference numeral 74. The deflection may be effected by an electrically conductive or semi-conductive material 62, preferably highly doped silicon. While the electrically conductive material 62 is in contact with the second end portion 14, a voltage 52 is applied between the base 44 and the second end portion 14 to effect anodic bonding of the second end portion 14 to the base. In alternative embodiments, the first and/or second bondings between the layer 12 (as well as the layer 46 discussed below herein) and base 44 may be effected through the use of frit, fusion, eutectic, epoxy attachment or other appropriate types of bonding techniques.

As such, before bonding the silicon 12 to the glass 44, a partial etch is performed to create the intermediate portion 70 near the anchor location 40 in order to thin the material at that location. Doing so causes the structure to be more flexible in the vertical direction. Additionally, the gap between the glass and the surface of the partially etched silicon will prevent the anodic bond from forming near the anchor and causing unduly high stresses.

Figures 1, 3:
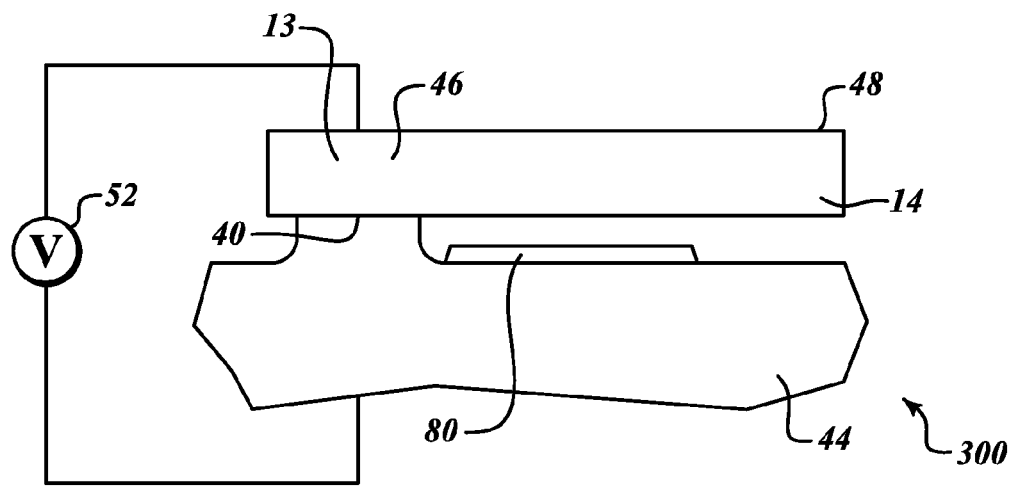
Figures 2, 3:
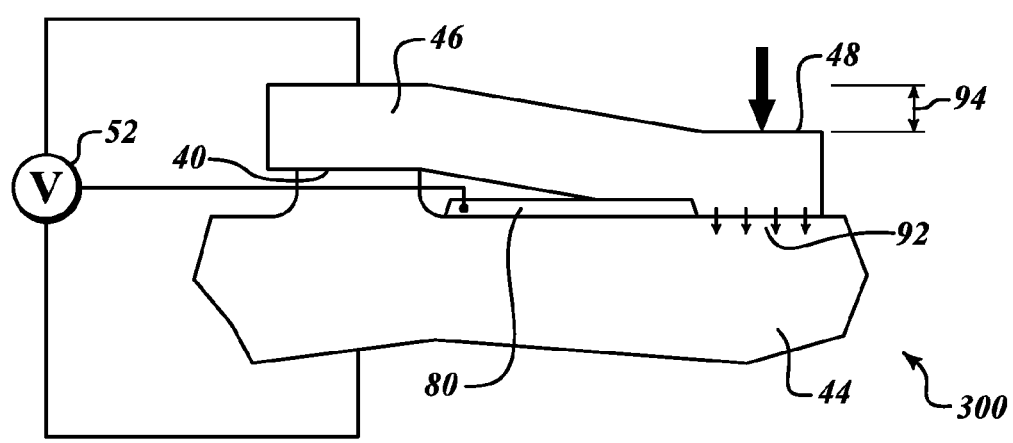

FIGS. 3-1 and 3-2 illustrate side views of the construction of a vertically offset silicon structure 300 of a microelectromechanical system (MEMS) device formed in accordance with another embodiment of the invention. The structure 300 is formed from a silicon layer 46 and a base 44. In an embodiment, the base 44 is made of glass. The silicon layer 46 includes first and second end portions 13, 14. A conductive (e.g., metallic) layer 80 is deposited on the glass base 44. The silicon layer 46 is electrically coupled to the conductive layer 80 and a voltage source 52.

The first end portion 13 is bonded to the glass base 44 to form an anchor 40. In the case of a silicon layer 46 and a glass base 44, anodic bonding may be used to bond the layer 46 to the base 44. When the base 44 and silicon layer 46 are made of different materials, appropriate bonding techniques known to those having ordinary skill in the art may be used.

Subsequently, and as best illustrated in FIG. 3-2, the second end portion 14 of the silicon layer 46 is deflected a vertical distance 94 until the second end portion contacts the base 44 as indicated by reference numeral 92. The deflection may be effected by an electrically conductive or semi-conductive material, preferably highly doped silicon. While the electrically conductive material is in contact with the second end portion 14, a voltage 52 is applied between the base 44 and the second end portion 14 to effect anodic bonding of the second end portion 14 to the base.

As such, before bonding the glass 44 and silicon 46 together, a metal layer 80 is deposited on the glass under a push-down flexure. This metal is electrically connected to the silicon layer 46 at the first anodic bond 40. During the second anodic bonding, the metal and silicon will be at the same potential, and there will be no force pulling the silicon down near the anchors. This will prevent high stresses from forming near the anchor 40.

Figures 1, 4:
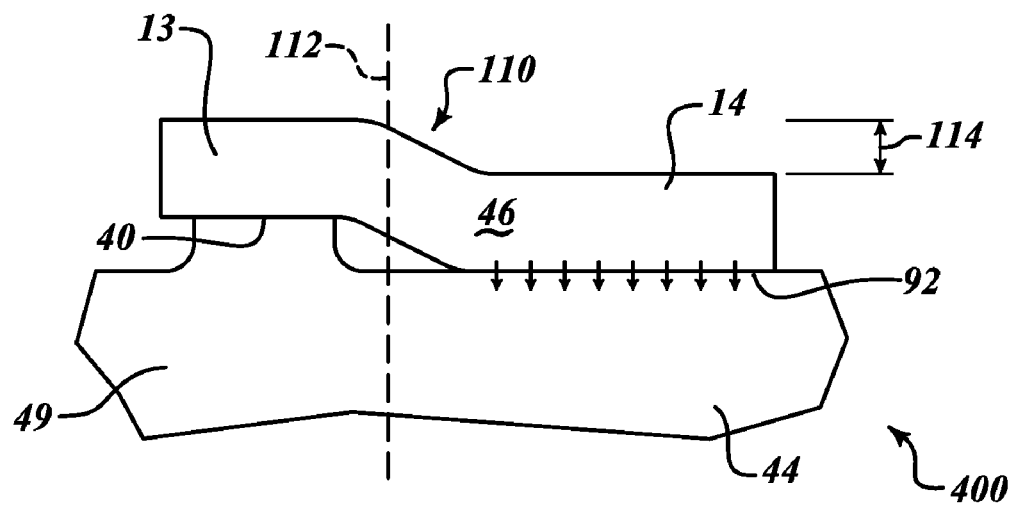
Figures 2, 4:
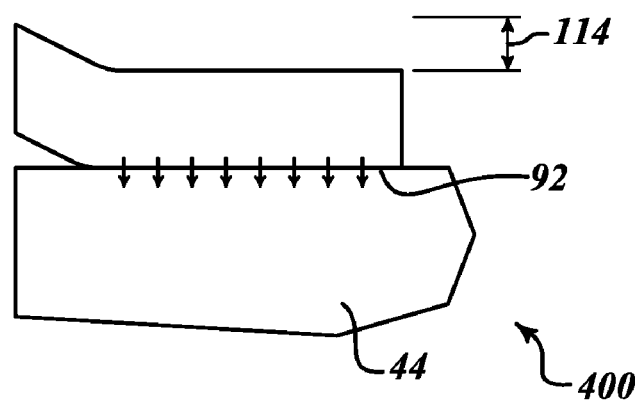

FIGS. 4-1 and 4-2 illustrate side views of the construction of a vertically offset silicon structure 400 of a microelectromechanical system (MEMS) device formed in accordance with another embodiment of the invention. The structure 400 is formed from a silicon layer 46 and a base 44. In an embodiment, the base 44 is made of glass. The silicon layer 46 includes first and second end portions 13, 14.

The first end portion 13 is bonded to the glass base 44 at an end portion 49 to form an anchor 40. In the case of a silicon layer 46 and a glass base 44, anodic bonding may be used to bond the layer 46 to the base 44. When the base 44 and silicon layer 46 are made of different materials, appropriate bonding techniques known to those having ordinary skill in the art may be used.

The second end portion 14 of the silicon layer 46 is deflected a vertical distance 114 until the second end portion contacts the base 44 as indicated by reference numeral 92. The deflection may be effected by an electrically conductive or semi-conductive material, preferably highly doped silicon. While the electrically conductive material is in contact with the second end portion 14, a voltage is applied between the base 44 and the second end portion 14 to effect anodic bonding of the second end portion 14 to the base, thereby forming a bent portion 110 of the silicon layer.

Subsequently, and as best illustrated in FIG. 4-2, the first end portion 13 and glass-base end portion 49 are removed at a dicing plane 112 located at the bent portion 110 to produce the finished structure. In this manner, when the die are singulated, the anchors 40 are removed along with associated stresses caused by deflection of the layer 46.

While a preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method of constructing a permanent vertically offset structure, comprising the steps of:
    forming a flexible layer comprising:
        first and second end portions;
        an intermediate portion coupling the first and second end portions; and
        upper and lower surfaces,
        wherein the distance between the upper and lower surfaces at the intermediate portion is less than the distance between the upper and lower surfaces at the first and second end portions;
    bonding the first end portion to a base member;
    deflecting the second end portion of the flexible layer until the second end portion contacts the base member; and
    directly bonding the second end portion to the base member.

2. The method of claim 1, wherein bonding the first end portion to a base member includes anodically bonding the first end portion to the base member.

3. The method of claim 1, wherein deflecting includes deflecting with one of an electrically conductive and an electrically semi-conductive material.

4. The method of claim 1, wherein forming the flexible layer comprises etching the lower surface to form the intermediate portion.

5. The method of claim 1, wherein bonding the second end portion to the base member includes anodically bonding the second end portion to the base member.

6. The method of claim 3, wherein deflecting includes deflecting with highly doped silicon.

7. The method of claim 1 wherein the flexible layer comprises silicon.

8. A method of constructing a permanent vertically offset structure, comprising the steps of:
    forming a flexible layer having first and second end portions;
    depositing a conductive layer on a base member;
    electrically coupling the flexible layer to the conductive layer;
    bonding the first end portion to the base member;
    deflecting the second end portion of the flexible layer until the second end portion contacts the base member; and
    directly bonding the second end portion to the base member.

9. The method of claim 8, wherein bonding the first end portion to a base member includes anodically bonding the first end portion to the base member.

10. The method of claim 8, wherein deflecting includes deflecting with one of an electrically conductive and an electrically semi-conductive material.

11. The method of claim 10, wherein deflecting includes deflecting with highly doped silicon.

12. The method of claim 8, wherein bonding the second end portion to the base member includes anodically bonding the second end portion to the base member.

13. The method of claim 8, wherein the conductive layer comprises a metallic layer.

14. The method of claim 8 wherein the flexible layer comprises silicon.

15. A method of constructing a permanent vertically offset structure, comprising the steps of:
    forming a flexible layer having first and second end portions;
    bonding the first end portion to a base-member end portion;
    deflecting the second end portion of the flexible layer until the second end portion contacts the base member, thereby forming a bent portion of the flexible layer;
    directly bonding the second end portion to the base member; and removing at the bent portion the first end portion and base-member end portion.

16. The method of claim 15, wherein bonding the first end portion to a base member includes anodically bonding the first end portion to the base member.

17. The method of claim 15, wherein deflecting includes deflecting with one of an electrically conductive and an electrically semi-conductive material.

18. The method of claim 17, wherein deflecting includes deflecting with highly doped silicon.

19. The method of claim 15, wherein bonding the second end portion to the base member includes anodically bonding the second end portion to the base member.

20. The method of claim 15 wherein the flexible layer comprises silicon.

* * * * *